United States Patent [19]

Holman, III

[11] Patent Number: 4,634,657

[45] Date of Patent: Jan. 6, 1987

[54] PHOTOIMAGING COMPOSITIONS CONTAINING SUBSTITUTED 1,2-DIBROMOETHANES

[75] Inventor: Bruce Holman, III, Wilmington, Del.

[73] Assignee: E. I. Du Pont de Nemours and Company, Wilmington, Del.

[21] Appl. No.: 643,397

[22] Filed: Aug. 23, 1984

[51] Int. Cl.$^4$ .......................... G03C 1/68; G03C 1/52
[52] U.S. Cl. ..................... 430/281; 430/344; 430/288; 430/286; 430/292
[58] Field of Search .............. 430/344, 270, 281, 288, 430/292, 286; 346/218

[56] References Cited

U.S. PATENT DOCUMENTS

| | | | |
|---|---|---|---|
| 3,377,167 | 4/1968 | Fichter | 96/48 |
| 3,476,562 | 11/1969 | Yamada et al. | 96/88 |
| 3,525,616 | 8/1970 | Hackmann et al. | 96/36 |
| 3,769,023 | 10/1973 | Lewis et al. | 96/48 |
| 4,065,315 | 12/1977 | Yamazaki et al. | 96/48 QP |
| 4,343,885 | 8/1982 | Reardon | 430/344 |
| 4,360,583 | 11/1982 | Engler et al. | 430/344 |
| 4,465,761 | 8/1984 | Takegawa et al. | 430/344 |
| 4,500,897 | 2/1985 | Matsuda et al. | 346/218 |

Primary Examiner—Won H. Louie

[57] ABSTRACT

Photoimaging compositions comprising (a) substituted dibromoethane as defined, e.g., 1,2-dibromotetrachloroethane, 1,2-dibromo-1,1-dichloroethane, etc. and (b) leuco dye. Photoimaging photopolymerizable compositions consist essentially of (a) substituted 1,2-dibromoethane as defined, (b) leuco dye, (c) at least one ethylenically unsaturated compound, (d) photoinitiator taken from the group consisting of -4-trichloromethyl-4-methyl-2,5-cyclohexadienones, benzophenones, alkylaryl ketones, and mixtures thereof; and optionally (e) at least one organic polymeric binder. The compositions are useful to provide a printout image and in admixture with a variety of initiators or initiator systems and ethylenically unsaturated compounds provide photopolymerizable compositions having good printout images.

19 Claims, No Drawings

PHOTOIMAGING COMPOSITIONS CONTAINING SUBSTITUTED 1,2-DIBROMOETHANES

DESCRIPTION

1. Technical Field

This invention relates to new photoimaging compositions. More particularly this invention relates to photoimaging compositions containing substituted 1,2-dibromoethane compounds. Still more particularly this invention relates to photopolymerizable compositions comprising substituted 1,2-dibromoethane, leuco dye, monomeric compound, and photoinitiator.

2. Background Art

Photoimaging compositions utilizing a leuco dye and/or an addition polymerizable ethylenically unsaturated compound in conjunction with hexaarylbiimidazole compounds are known. Such compositions have been useful in the preparation of proofing papers or in photopolymerizable elements depending on their formulation. Hexaarylbiimidazole compounds that can be used in these formulations include: 2,2'-bis(o-chlorophenyl)-4,4',5,5'-tetrakis-m-methoxyphenyl)-biimidazole, 2,2'-bis(o-chlorophenyl)-4,4',5,5'-tetraphenylbiimidazole and 2,2',4,4'-tetrakis-(o-chlorophenyl)-5,5'-bis(m,p-dimethoxyphenyl)-biimidazole, etc. Compositions containing hexaarylbiimidazole compounds have certain disadvantages. The biimidazole compounds show some tendency to crystallize out of the photosensitive compositions in which they are present. The biimidazole compounds are also relatively expensive.

Other photoimaging compositions useful for forming printout images are known. Yamada et al. U.S. Pat. No. 3,476,562 and Lewis et al. U.S. Pat. No. 3,769,023 disclose printout image formation using compositions containing haloorganic compounds. The printout image is relatively poor, however, because unlike the compositions containing hexaarylbiimidazole compounds, non-haloorganic initiators present give weak color images or no color if used alone.

It is therefore desirable to provide photoimaging compositions, including photopolymerizable compositions, which have good printout capabilities even when nonhalo initiators present in the compositions give weak color images or no colored image when used separately in the presence of a leuco dye. It is also desirable to provide a printout photoimaging composition utilizing a particular haloorganic compound and a leuco dye which provides an improved printout capability.

DISCLOSURE OF THE INVENTION

In accordance with this invention there is provided a printout photoimaging composition comprising an admixture of (a) a substituted 1,2-dibromoethane of the formula

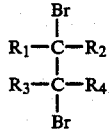

wherein a first bond dissociation energy for the C—Br bond of the carbon atoms attached to $R_1$ and $R_2$ is not greater than 59 kilocalories per mol. °C. and is not greater than the dissociation energy of the second C—Br bond, $R_1$ and $R_2$ are individually either chlorine or $CCl_3$; $R_3$ and $R_4$ independently are H—, F—, Cl—, lower alkyl of 1 to 3 carbon atoms, $F_3C$—, $ClH_2C$—, and straight chain α-monofluorinated aliphatic radical optionally branched and/or unsaturated only beyond the γ-carbon atom, said α-carbon atom being that nearest the carbon holding the second carbon-bromine bond; and (b) a leuco dye.

In accordance with an embodiment of this invention there is provided a photoimaging photopolymerizable composition consisting essentially of an admixture of components (a) and (b) described above and the following components:

(c) at least one nongaseous ethylenically unsaturated compound having a boiling point above 100° C. at normal atmospheric pressure;

(d) a photoinitiator taken from the group consisting of -4-trichloromethyl-2,5-cyclohexadienones, benzophenones, alkylaryl ketones, and mixtures thereof; and (e) optionally at least one organic polymeric binder.

The printout photoimaging compositions are photosensitive and when at least one ethylenically unsaturated monomeric compound is present the composition is a photopolymerizable composition. The printout photoimaging compositions as defined above comprise (a) a substituted 1,2-dibromoethane compound and (b) a leuco dye. Other components which may be present with the substituted 1,2-dibromoethane compound and the leuco dye are at least one film-forming polymeric binder, plasticizers, anti-blocking agents, dyes, etc. A suitable inert solvent or mixture of solvents is generally present in preparing the formulations.

In the photopolymerizable compositions, in addition to (a) the substituted 1,2-dibromoethane compound and (b) leuco dye, there are present (c) at least one nongaseous ethylenically unsaturated compound, (d) a photoinitiator taken from the group consisting of -4-trichloromethyl-2,5-cyclohexadienones, benzophenones, alkylaryl ketones, and mixtures thereof, and (e) optionally at least one film-forming organic polymeric binder. In addition, plasticizers, inhibitors, anti-blocking agents, ultraviolet absorbers, oxygen scavengers, chain transfer agents, energy transfer dyes, etc. can be present. A suitable inert solvent or mixture of solvents is present in preparing the photopolymerizable formulations.

The substituted 1,2-dibromoethane compounds (a) useful in the printout photoimaging composition and photopolymerizable composition are broadly defined in the formula set forth above, preferably the 1,2-dibromoethane compound is a 1,2-dibromo-1,1-dichloroethane of the formula:

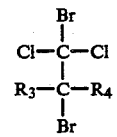

wherein $R_3$ and $R_4$ independently are hydrogen, chlorine or fluorine. Particularly preferred substituted 1,2-dibromoethane compounds are: 1,2-dibromotetrachloroethane, 1,2-dibromo-1,1,2-trichloroethane, 1,2-dibromo-1,1-dichloroethane and 1,2-dibromo-1,1-dichloro-2,2-difluoroethane. The 1,2-dibromoethanes may be synthesized by known procedures. Some compounds are commercially available from Columbia Organic Chemicals Co., Aldrich, Pfalz and Bauer, and Fairfield Chemical Co.

The leuco form of the dye, which comprises one component of a photoimaging composition of the present invention, is the reduced form of the dye having one or two hydrogen atoms, the removal of which together with an additional electron in certain cases produces the dye, i.e., a differently colored compound. Generally when the leuco form has only one removable hydrogen and the resultant dye is cationic, then there is also present a mineral acid, organic acid, or acid-supplying compound which forms a salt with the leuco form of the dye. Such dyes have been described, for example, in U.S. Pat. No. 3,445,234, column 2, line 49 to column 8, line 55, incorporated by reference. The following classes are included:

(a) aminotriarylmethanes
(b) aminoxanthenes
(c) aminothioxanthenes
(d) amino-9,10-dihydroacridines
(e) aminophenoxazines
(f) aminophenothiazines
(g) aminodihydrophenazines
(h) aminodiphenylmethanes
(i) leuco indamines
(j) aminohydrocinnamic acids (cyanoethanes, leuco methines)
(k) hydrazines
(l) leuco indigoid dyes
(m) amino-2,3-dihydroanthraquinones
(n) tetrahalo-p,p'-biphenols
(o) 2(p-hydroxyphenyl)-4,5-diphenylimidazoles
(p) phenethylanilines Of these leuco forms, (a) through (i) form the dye by losing one hydrogen atom, while the leuco forms (j) through (p) lose two hydrogen atoms to produce the parent dye. Aminotriarylmethanes are preferred. A general preferred aminotriarylmethane class is that of the acid salts of aminotriarylmethanes wherein at least two of the aryl groups are phenyl groups having (a) an $R_1R_2N$-substituent in the position para to the bond to the methane carbon atom wherein $R_1$ and $R_2$ are each groups selected from hydrogen, $C_1$ to $C_{10}$ alkyl, 2-hydroxyethyl, 2-cyano-ethyl, or benzyl and (b) a group ortho to the methane carbon atom which is selected from lower alkyl (C is 1 to 4), lower alkoxy (C is 1 to 4), fluorine, chlorine or bromine; and the third aryl group may be the same as or different from the first two, and when different is selected from (a) Phenyl which can be substituted with lower alkyl, lower alkoxy, chloro, diphenylamino, cyano, nitro, hydroxy, fluoro or bromo;
(b) Naphthyl which can be substituted with amino, di-lower alkylamino, alkylamino;
(c) Pyridyl which can be substituted with alkyl;
(d) Quinolyl;
(e) Indolinylidene which can be substituted with alkyl.

Preferably, $R_1$ and $R_2$ are hydrogen or alkyl of 1 to 4 carbon atoms.

With the leuco form of dyes which have amino or substituted amino groups within the dye structure and which are characterized as cationic dyes, an amine salt-forming mineral acid, organic acid or an acid from a compound supplying acid is employed. The amount of acid usually varies from 0.33 mol to 1 mol per mol of amino nitrogen in the dye. The preferred quantity of acid is about 0.5 to 0.9 mol per mol of amino nitrogen.

Representative acids which form the required amine salts are hydrochloric, hydrobromic, sulfuric, phosphoric, acetic oxalic, p-toluenesulfonic, trichloroacetic, trifluoroacetic and perfluoroheptanoic acid. Other acids such as acids in the "Lewis" sense or acid sources which may be employed in the presence of water or moisture include zinc chloride, zinc bromide, and ferric chloride. Representative leuco dye salts include tris-(4-diethylamino-o-tolyl) methane zinc chloride, tris-(4-diethylamino-o-tolyl) methane oxalate, tris-(4-diethylamino-o-tolyl) methane p-toluenesulfonate, etc.

The presence of a leuco dye in combination with the 1,2-dibromoethane compound produces a printout image where it is desired to identify polymerized areas. Preferred leuco dyes are those having at least one dialkylamino group and a leuco triphenylamine dye or various salts of the dye, e.g., the HCl salt of the leuco blue dye. Illustrations of suitable dyes include: tris-(4-N,N-diethyl-amino-o-tolyl)-methane trihydrochloride, bis(4-N,N-diethyl-amino-o-tolyl)triphenylmethane, bis(4-N,N-diethyl-amino-o-tolyl)methylenedioxy-phenylmethane, leuco neutral shade dye, i.e., bis(4-N,N-diethylamino-o-tolyl)benzyl thiophenylmethane, Leuco Malachite Green (C.I. Basic Green 4), leuco forms of Crystal Violet, Brilliant Green (C.I. Basic Green 1), Victoria Green 3B (C.I. No. 42030), Basic Green 4 (C.I. 42000), Acid Green GG (C.I. Acid Green 3), Methyl Violet (C.I. Basic Violet 1), Rosaniline (C.I. Basic Violet 14), etc. The salt forms, e.g., HCl salt, salts with Lewis acid, sulfuric acid salts, p-toluene sulfonic, acid salts, etc., of the leuco dye is preferred for use. The leuco dye, when used is generally present in a mole ratio of leuco dye to the substituted 1,2-dibromoethane compound of 0.1 to 10.

In photopolymerizable compositions of this invention, in addition to the two above-described components, at least one nongaseous ethylenically unsaturated compound (c) having a boiling point above 100° C. at normal atmospheric pressure is present. Such compounds generally are capable of forming a high polymer by free-radical initiated chain propagating, addition polymerization.

Preferably, the monomeric compound has at least two terminal ethylenically unsaturated groups, e.g., 2 to 4 groups. The monomeric compounds are nongaseous, i.e., at 20° C. and atmospheric pressure, have a normal boiling point about 100° C. and a plasticizing action on any thermoplastic polymeric binder that may be present.

Ethylenically unsaturated monomeric compounds useful in this invention include monomeric compounds or polymers wherein the ethylenic unsaturation is present as an extralinear substituent attached to the polymer backbone.

Suitable monomers which can be used as the sole monomer or in combination with others include the following: t-butyl acrylate, 1,5-pentanediol diacrylate, N,N-diethylaminoethyl acrylate, ethylene glycol diacrylate, 1,4-butanediol diacrylate, diethylene glycol diacrylate, hexamethylene glycol diacrylate, 1,3-propanediol diacrylate, decamethylene glycol diacrylate, decamethylene glycol dimethacrylate, 1,4-cyclohexanediol diacrylate, 2,2-dimethylolpropane diacrylate, glycerol diacrylate, tripropylene glycol diacrylate, glycerol triacrylate, trimethylolpropane triacrylate, pentaerythritol triacrylate, polyoxyethylated trimethylolpropane triacrylate and trimethacrylate and similar compounds as disclosed in U.S. Pat. No.

3,380,831 incorporated by reference, 2,2-di(p-hydroxyphenyl)-propane diacrylate, pentaerythritol tetraacrylate, 2,2-di-(p-hydroxyphenyl)-propane dimethacrylate, triethylene glycol diacrylate, polyoxyethyl-2,2-di-(p-hydroxyphenyl)-propane dimethacrylate, di-(3-methacryloxy-2-hydroxypropyl)-ether of bisphenol-A, di-(2-methacryloxyethyl) ether of bisphenol-A, di-(2-acryloxyethyl) ether of bisphenol-A, di-(3-methacryloxy-2-hydroxypropyl) ether of tetrachloro-bisphenol-A, di-(2-methacryloxyethyl) ether of tetrachloro-bisphenol-A, di-(3-methacryloxy-2-hydroxypropyl) ether of tetrabromo-bisphenol-A, di(2-methacryloxyethyl) ether of tetrabromo-bisphenol-A, di-(3-methacryloxy-2-hydroxypropyl) ether of 1,4-butanediol, di-(3-methacryloxy-2-hydroxypropyl) ether of diphenolic acid, triethylene glycol dimethacrylate, polyoxypropyltrimethylol propane triacrylate (462), ethylene glycol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, diallyl fumarate, styrene, 1,4-benzenediol dimethacrylate, 1,4-diisopropenyl benzene, and 1,3,5-triisopropenyl benzene.

In addition to the ethylenically unsaturated monomers mentioned above, the composition can also contain at least one of the following free radical-initiated, chain-propagating, addition-polymerizable, ethylenically unsaturated compounds having a molecular weight of at least 300. Preferred monomers of this type are an alkylene or a polyalkylene glycol diacrylate prepared from an alkylene glycol of 2 to 15 carbons or a polyalkylene ether glycol of 1 to 10 ether linkages, and those disclosed in U.S. Pat. No. 2,927,022, which is incorporated by reference, e.g., those having a plurality of addition polymerizable ethylenic linkages, particularly when present as terminal linkages. Especially preferred are those wherein at least one and preferably most of such linkages are conjugated with a double-bonded carbon, including carbon double-bonded to carbon and to such heteroatoms as nitrogen, oxygen and sulfur. Outstanding are such materials wherein the ethylenically unsaturated groups, especially the vinylidene groups, are conjugated with ester or amide structures.

Useful polymers having ethylenically unsaturated groups attached thereto are: the polymerizable, ethylenically unsaturated polymers of U.S. Pat. No. 3,043,805 and U.S. Pat. No. 2,929,710, which are incorporated by reference, e.g., polyvinyl acetate/acrylate, cellulose acetate/acrylate, cellulose acetate/methacrylate, N-acrylyloxymethyl polyamide, etc.; polyoxyethylated trimethylol propane triacrylate, polytetramethylene glycol diacrylate, etc., disclosed in U.S. Pat. No. 3,418,295, which is incorporated by reference.

A photoinitiator (d) is also present in the photopolymerizable composition. The photoinitiator is of a specific type or mixtures thereof i.e., -4-trichloromethyl-2,5-cyclohexadienone, benzophenone or alkylaryl ketone types. Cyclohexadienone compounds useful in this invention are of the formula

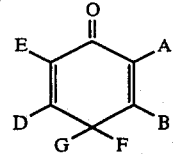

wherein each of A, B, D and E can be hydrogen, an alkyl group of 1 to 9 carbon atoms, bromo chloro, an aryl group of 6 to 10 carbon atoms, an aralkyl group wherein the aryl moiety is of 6 to 10 carbon atoms and the alkyl moiety is of 1 to 5 carbon atoms, an alkaryl group wherein the aryl moiety is of 6 to 10 carbon atoms and the alkyl moiety is of 1 to 5 carbon atoms, an alkoxy group of 1 to 4 carbon atoms, and A and B and D and E when taken together may form a benzene ring, F is $CCl_3$ or $CHCl_2$; and G can be an alkyl group of 1 to 18 carbon atoms and an aryl group of 6 to 10 carbon atoms. Specific cyclohexadienone compounds are disclosed in Sysak, U.S. Pat. No. 4,341,860, column 2, line 50 to column 3, line 37, the disclosure of which is incorporated by reference.

Benzophenones useful as photoinitiators include: benzophenone, 4,4'-dichlorobenzophenone, fluorenone, anthrone, thioxanthone, xanthone, Michler's ketone, ethyl Michler's ketone, 4-dimethoxyaminobenzophenone, 4-morpholinobenzophenone.

Useful alkylaryl ketones include vicinal ketaldonyl alcohols such as benzoin, pivaloin, acyloin ethers, e.g., benzoin methyl ether, benzoin ethyl ether, benzoin isopropyl ether, benzoin phenyl ether, benzoin t-butyl ether, benzoin sec-butyl ether, benzoin isobutyl ether, benzoin n-butyl ether; α-hydrocarbon-substituted aromatic acyloins, including α-methylbenzoin, α-allylbenzoin and α-phenylbenzoin, benzoin dialkyl ketals such as benzil dimethylketal, benzil ethyleneglycol ketal, benzil, benzoin esters such as O-acetyl benzoin and O-acylated oximinoketones such as 1-phenyl-1,2-propanedione-2-O-benzoyloxime.

Optionally, but preferably, at least one organic polymeric binder (e) can be present in the photopolymerizable composition. A binder can also be present in the photoimaging composition with the 1,2-dibromoethane compound and the leuco dye. The polymeric binder can be present to thicken the formulations, adhere them to substrates, or serve as a matrix for the color-forming composition. Suitable film-forming polymeric organic binders include: polyacrylate and alpha-alkyl polyacrylate esters, e.g., polymethyl methacrylate and polyethyl methacrylate; polyvinyl esters, e.g., polyvinyl acetate, polyvinyl acetate/acrylate, polyvinyl acetate/methacrylate and hydrolyzed polyvinyl acetate; ethylene/vinyl acetate copolymers; polystyrene polymers and copolymers, e.g., with maleic anhydride and esters; vinylidene chloride copolymers, e.g., vinylidene chloride/acrylonitrile; vinylidene chloride/methacrylate and vinylidene chloride/vinyl acetate copolymers; polyvinyl chloride and copolymers, e.g., polyvinyl chloride/acetate; saturated and unsaturated polyurethanes; synthetic rubbers, e.g., butadiene/acrylonitrile, acrylonitrile/butadiene/styrene, methacrylate/acrylonitrile/butadiene/styrene copolymers, 2-chlorobutadiene-1,3 polymers, chlorinated rubber, and styrene/butadiene/styrene, styrene/isoprene/styrene block copolymers; high molecular weight polyethylene oxides of polyglycols having number average molecular weights from about 4,000 to 1,000,000; epoxides, e.g., epoxides containing acrylate or methacrylate groups; copolyesters, e.g., those prepared from the reaction product of a polymethylene glycol of the formula $HO(CH_2)_nOH$, where n is a whole number 2 to 10 inclusive, and (1) hexahydroterephthalic, sebacic and terephthalic acids, (2) terephthalic, isophthalic and sebacic acids (3) terephthalic and sebacic acids, (4) terephthalic and isophthalic acids, and (5) mixtures of copolyesters prepared from said glycols and (i) terephthalic, isophthalic and sebacic acids and (ii) terephthalic, isophthalic, sebacic and adipic acids; nylons or polyamides, e.g., N-methoxymethyl polyhexamethylene adipamide; cellulose esters, e.g., cellulose acetate, cellulose acetate succinate and cellulose acetate butyrate, cellulose ethers, e.g., methyl cellulose, ethyl cellulose and benzyl cellulose; polycarbonates; polyvinyl acetal, e.g., polyvinyl butyral, polyvinyl formal; polyformaldehydes.

The binder can contain sufficient acidic or other groups to render the composition processible in aqueous developer. Useful aqueous-processible binders include those disclosed in U.S. Pat. No. 3,458,311 and in U.K. Pat. No. 1,507,704, which are incorporated by reference. Useful amphoteric polymers include interpolymers derived from N-alkylacrylamide or methacrylamide acidic film-forming comonomer and an alkyl or hydroxyalkyl acrylate such as those disclosed in U.S. Pat. No. 3,927,199, which is incorporated by reference.

It may be desirable to add a plasticizer, e.g., solid or liquid, to give flexibility to the film or coating. Suitable plasticizers are disclosed in U.S. Pat. No. 3,658,543, column 10, lines 20 to 73, incorporated by reference. A preferred liquid plasticizer is nonylphenoxypoly(ethyleneoxy)ethanol. A preferred solid plasticizer is N-ethyl-p-toluenesulfonamide. The plasticizers can be used in concentration ranging from 1:20 to 5:3, preferably 1:5 to 1:2, based on the weight of polymeric binder used.

Suitable thermal polymerization inhibitors that can be used in photopolymerizable compositions include p-methoxyphenol, hydroquinone, and alkyl- and aryl-substituted hydroquinones and quinones, tert-butyl catechol, pyrogallol, copper resinate, naphthylamines, beta-naphthol, cuprous chloride, 2,6-di-tert-butyl-p-cresol, phenothiazine pyridine, nitrobenzene and dinitrobenzene. Other useful inhibitors, include p-toluquinone and chloranil and thiazine dyes, e.g., Thionine Blue G (C.I. Basic Blue 25), and Toluidine Blue 0 (C.I. Basic Blue 17). Also useful as thermal polymerization inhibitors are the nitroso compositions disclosed in U.S. Pat. No. 4,168,982, which is incorporated by reference. In certain embodiments of the invention containing certain dye photoinitiators, however, no thermal inhibitor is required since these initiators have a dual function and in the dark serve as thermal inhibitors. The thermal polymerization inhibitor is preferably present in 0.001 to 2.0 parts per 100 parts of monomer and binder. Examples of suitable ultraviolet radiation absorbing materials are disclosed in U.S. Pat. No. 3,854,950, columns 3 and 4, incorporated by reference: 2,2'-dihydroxy-4-methoxybenzophenone is a preferred material. Oxygen scavengers, e.g., 2-allyl thiourea, stannous chloride, N-phenylglycine, etc. can be present. This type compound appears to eliminate or reduce the induction period usually found in a photopolymerizable reaction, possibly by consumption of oxygen in the layer prior to exposure.

In the printout photoimaging compositions the substituted 1,2-dibromoethane compound is present in an amount of about 0.001 to 99.99 percent by weight of solids, and the leuco dye is present in about 0.01 to 99.999 percent by weight of solids. Preferably a polymeric binder is present in the photoimaging compositions, e.g., in an amount up to 99.989% by weight based on the total weight of 1,2-dibromoethane compound, leuco dye and polymeric binder. Generally the leuco dye comprises 0.1 to 1.0% by weight and the 1,2-dibromoethane compound comprises 5.0 to 20.0% by weight of the photoimaging composition, and the binder is present in amounts of 79.0 to 94.9 percent by weight.

In the photopolymerizable compositions components (a), (b), (c), (d) and (e), as designated above, are present in the following weight percentage ranges based on the total weight of the photopolymerizable composition (a) 0.001 to 80, preferably 0.06 to 2.0,
(b) 0.05 to 90, preferably 0.1 to 1.0,
(c) 1 to 90, preferably 20 to 46,
(d) 0.001 to 20, preferably 0.1 to 1.0, and
(e) 0 to 90, preferably 50 to 70.

In preparing the formulation generally inert solvents are employed which are volatile at ordinary pressures. Examples include alcohols, e.g., methanol, ethanol, 1-propanol, 2-propanol, butanol, and ethylene glycol; ether alcohols, e.g., 2-ethoxy ethanol, 2-butoxy ethanol and diethylene glycol monomethyl ether; esters, e.g., methyl acetate and ethyl acetate; aromatics, e.g., benzene, o-dichlorobenzene and toluene; ketones, e.g., acetone, methyl ethyl ketone and 3-pentanone; aliphatic halocarbons, e.g., methylene chloride chloroform 1,1,2-trichloroethane, 1,1,2,2-tetrachloroethane and 1,1,2-trichloroethylene; miscellaneous solvents, e.g., dimethylsulfoxide, pyridine, tetrahydrofuran, dioxane, dicyanocyclobutane and 1-methyl-2-oxo-hexamethyleneimine; and mixtures of these solvents in various proportions as may be required to attain solutions. It is often beneficial to leave a small residue of solvent in the dried composition so that the desired degree of imaging can be obtained upon subsequent irradiation.

For imaging uses, the compositions of this invention may be coated upon or impregnated in substrates following known techniques. Substrates include materials commonly used in the graphic arts and in decorative applications such as paper ranging from tissue paper to heavy cardboard, films of plastics and polymeric materials such as regenerated cellulose, cellulose acetate, cellulose nitrate, polyethylene terephthalate, vinyl polymers and copolymers, polyethylene, polyvinyl-acetate, polymethyl methacrylate, polyvinylchloride; textile fabrics, glass, wood and metals, e.g., copper. The composition, usually as a solution in a carrier solvent described above, may be sprayed, brushed, applied by a roller or an immersion coater, flowed over the surface, picked up by immersion or spread by other means, and the solvent evaporated.

Any convenient source providing radiation of wavelengths in the range of 200 nm to 420 nm can be used to activate the photoimaging composition for image formation and photopolymerization initiation. The radiation may be natural or artificial, monochromatic or polychromatic, incoherent or coherent, and should be sufficiently intense to activate a substantial proportion of the photoinitiator.

Conventional light sources include fluorescent lamps, mercury, metal additive and arc lamps. Coherent light sources are the pulsed nitrogen-, xenon, argon ion- and ionized neon-lasers whose emissions fall within or overlap the ultraviolet or visible absorption bands of the photoinitiator. Ultraviolet and near-visible radiation-emitting cathode ray tubes widely useful in printout systems for writing on photosensitive materials are also useful with the subject compositions.

Images may be formed by writing with a beam of the activating light or by exposing to such light a selected area behind a negative, stencil, or other relatively opaque pattern. The negative may be silver on cellulose acetate or polyester film or one in which its opacity results from aggregations of areas having different refractive indices. Image formation may also be effected in conventional diazo printing apparatus, graphic arts exposure or electronic flash equipment and by projection as described in U.S. Pat. No. 3,661,461. The light exposure time may vary from a fraction of a second to several minutes, depending upon the intensity and spectral energy distribution of the light, its distance from the composition, the nature and amount of the composition available, and the intensity of color in the image desired. A preferred embodiment of the invention is described in Example 2 below.

INDUSTRIAL APPLICABILITY

The photoimaging compositions containing the 1,2-dibromoethane compounds described herein are useful in various photoimaging formulations which are particularly advantageous in exhibiting strong color images. The photoimaging compositions can be photopolymerizable or nonphotopolymerizable. Photopolymerizable compositions in layer or element embodiments are useful for printing purposes and a variety of copying, e.g., office copying, recording, decorative, and photoresist applications. Nonphotopolymerizable compositions which are light-sensitive are used for proofing papers, printout papers, overlay films, etc.

EXAMPLES

The following examples which are not limiting illustrate the invention wherein the parts and percentages are by weight. The molecular weight of the polymers are expressed as number average molecular weights ($\overline{M}n$) and weight average molecular weights ($\overline{M}w$). The $\overline{M}n$ of the polymers can be determined by gel permeation chromatography employing a polybutadiene standard or other polymer standard as is known to those skilled in the art. $\overline{M}w$ of the polymers can be determined by using a light gathering technique using known standard samples, e.g., polystyrene, polymethacrylic acid, polymethylmethacrylate etc. as known to those skilled in the art.

SYNTHESIS OF SUBSTITUTED 1,2-DIBROMOETHANES

1. 1,2-dibromotetrachloroethane

The preparation is described according to Schneider et al., U.S. Pat. No. 4,085,153, which is incorporated by reference. Another preparation is described in Ley and Meerholz and D. H. R. Barton "Diaryl Telluroxides as New Mild Oxidizing Reagents", *Tetrahedron*, Vol. 37, Supplement No. 1, pp. 213 to 223, 1981, particularly page 221, right column.

2. 1,2-dibromo-1,1,2-trichloroethane

The preparation is described according to Neubert, U.S. Pat. No. 3,637,874, which is incorporated by reference.

3. 1,2-dibromo-1,1-dichloroethane

The preparation is described according to a procedure described in Roedig and Försch "Valenzisomerisierung Perhalogenierter 4-Methylen-bicyclo[3.2.0]Hepta-2,6-Diene Zu Heptafulvenen", Liebigs Ann. Chem. 1978, pp. 804–812, particularly page 808, Experimenteller Teil.

4. 1,2-dibromo-1,1-dichloro-2,2-difluoroethane

The preparation is described according to a procedure described in Okuhara "Reaction of 1,1,2-Trichloro-1,2,2-Trifluoroethane And Other Fluorohalocarbons With Aluminum Halides In The presence And Absence Of Additives, Distinction In Carbonium Ion Character And Reaction Conditions Between Substitution And Isomerization," J. Org. Chem., Vol. 43. No. 14, 1978, pp. 2745–2449, particularly pp. 2748 and 2749.

EVALUATION AND TESTING

The photopolymerizable compositions described in Examples 1 to 7 of Table 1, and Example 9 were prepared by making stock solutions lacking one or more ingredients. Aliquots of the stock solutions and of the various additional ingredients were then combined to give the desired coating solutions. The compositions described in Example 8 were prepared by dissolving the components in the solvent with stirring.

Test coatings were conveniently made on 0.001 inch (0.025 mm.) polyethylene terephthalate support film employing an 0.008–0.010 inch (0.20–0.25 mm) doctor blade. and were then air-dried.

Films were exposed through a protective cover sheet of 0.001 inch (0.025 mm) polyethylene terephthalate and a 30-step cube-root-of-two, neutral density transmission grey scale. A Berkey-Ascor 30×40 Vacuum Printer having a 2-kw mercury photopolymer lamp was used as an exposure source at an integrated exposure level of 30–35 units on the Berkey-Ascor scale.

As shown in Examples 1 to 3, evaluation was initially done qualitatively by visual comparison, and an assignment of rank was made based on one of the two following scales:

| SCALE A | SCALE B |
| --- | --- |
| Excellent | (1) printout visually at least as intense as that of a control coating employing a hexaarylbiimidazole* compound instead of a haloorganic compound. |
| Good | (2) Intensity intermediate between (1) above and a control coating containing no hexaacrylbiimidazole compound. |
| Fair | (3) Equal to, or less intense than, a control coating containing no hexaarylbiimidazole compound. |
| Poor | (4) No response. |

*The hexaarylbiimidazole used as a control is 2,2'-bis(o-chlorophenyl)-4,4',5,5'-tetraphenylbiimidazole is an amount 25 times that of the haloorganic compound on a weight to weight basis.

As shown in Examples 4 to 7, quantitative evaluation was accomplished by determining the absorbance increase, at 600 nm. as read with a Perkin-Elmer Model 330 UV-VIS spectrophotometer. Comparison of qualitative and quantitative results in instances when both were available for given compounds allowed assignment of approximate absorbance increases to those compounds for which only qualitative results were at hand. Absorbance increases were normalized on a scale of 0.00 to 1.00 designated in Table 2 below as Normalized Printout Image Intensity (POI) were 0.00 corresponds to the result with no haloorganic compound, and 1.00 corresponds to the haloorganic compound yielding the most intense printout image. POI is determined by subtracting the printout image intensity with no haloorganic compound from the printout image intensity with test haloorganic compound divided by printout image intensity of the most instance printout image obtained with said haloorganic compounds.

Table 2 lists the normalized printout image intensity (POI) for the stated haloorganic compounds. Where a range is given the values have been estimated as indicated above. Table 2 also lists corresponding Bond Dissociation Energy (BDE) for the haloorganic compounds. BDE's were calculated as taught by L. A. Errede, J. Phys. Chem., Vol. 64, 1960, pp. 1031–1034.

TABLE 1
COATING COMPOSITIONS

| COMPONENT TYPES | INGREDIENTS |
|---|---|
| POLYMERIC BINDERS | 1. Poly(methyl methacrylate) (98)/methacrylic acid(2) $\overline{M}w$: 29,000 $\overline{M}n$: 15,000 |
| | 2. Poly(methyl methacrylate), $\overline{M}w$: 629,000; $\overline{M}n$: 129,000 |
| | 3. Poly(methylmethacrylate) (46)/acrylonitrile (9)/butadiene (14)/styrene (31) |
| | 4. Poly(methyl methacrylate) (95)/ethyl methacrylate (5) |
| | 5. Poly(methyl methacrylate), Tg: 100° C.; Brookfield visc.: 1200–1900 c.p.s./25° C./35% in methyl ethyl ketone |
| MONOMER | 6. Trimethylolpropane triacrylate |
| INITIATORS | 7. 4-Methyl-4-trichloromethyl-2 5-cyclohexadienone |
| | 8. bis-4,4'-Dimethylaminophenyl ketone (Michler's ketone) |
| | 9. bis-4,4'-Diethylaminophenyl ketone (ethyl Michler's ketone) |
| | 10. Benzophenone |
| COLORANTS | 11. C.I. Pigment Green 18 |
| | 12. C.I. Pigment Green 7 |
| PRINT-OUT SYSTEM | 13. Leuco Crystal Violet |
| | 14. p-Toluene Sulfonic Acid |
| | 15. Haloorganic Compound |
| PLASTICIZERS | 16. Triethyleneglycol Diacetate |
| | 17. o,p-toluenesulfonamide |
| INHIBITORS | 18. Benzotriazole |
| | 19. 5-Chlorobenzotriazole |
| | 20. 1-phenylpyrazolidine-3-one |
| SOLVENTS (% v/v) | 21. Methylene Chloride |
| | 22. Methanol |
| SOLUTES IN SOL'N (%) | 23. |

| Ingredient No. | Ex. 1 | Ex. 2 | Ex. 3 | Ex. 4 | Ex. 5 | Ex. 6 | Ex. 7 |
|---|---|---|---|---|---|---|---|
| 1 | — | — | — | 31.90 | 31.90 | 31.90 | 31.90 |
| 2 | 12.08 | 9.78 | 9.78 | 26.72 | 26.72 | 26.72 | 26.72 |
| 3 | 13.79 | — | — | — | — | — | — |
| 4 | — | 46.05 | 46.05 | — | — | — | — |
| 5 | 40.92 | — | — | — | — | — | — |
| 6 | 20.46 | 32.61 | 32.61 | 29.90 | 29.90 | 29.90 | 29.90 |
| 7 | 0.04 | 0.01 | — | — | 0.10 | 0.10 | 4.00 |
| 8 | — | 0.15 | 0.15 | 0.20 | 0.20 | 0.20 | 0.21 |
| 9 | 0.06 | — | — | — | — | — | — |
| 10 | 1.60 | 3.91 | 3.91 | 3.80 | 3.70 | 3.70 | — |
| 11 | 0.04 | 0.04 | 0.04 | 0.03 | 0.03 | 0.02 | — |
| 12 | — | 0.11 | 0.11 | — | — | — | — |
| 13 | 0.20 | 0.05 | 0.05 | 0.30 | 0.30 | 0.30 | 0.20 |
| 14 | 0.12 | 0.05 | 0.05 | — | — | — | — |
| 15 | 0.20 | 0.10 | 0.10 | 0.26 | 0.26 | 0.25 | 0.25 |
| 16 | — | — | — | 2.00 | 2.00 | 2.00 | 6.99 |
| 17 | 22.00 | 6.52 | 6.52 | — | — | — | — |
| 18 | — | 0.20 | 0.20 | 0.20 | 0.20 | 0.20 | 0.35 |
| 19 | — | — | — | — | — | — | — |
| 20 | 40 PPM | — | — | — | — | — | — |
| 21 | 100 | 92 | 92 | 92 | 92 | 92 | 92 |
| 22 | — | 8 | 8 | 8 | 8 | 8 | 8 |
| 23 | 34.37 | 34.37 | 30.00 | 30.00 | 30.00 | 33.33 | 33.33 |

TABLE 2

| Haloorganic Compound* | POI | BDE |
|---|---|---|
| 1 1,2-Dibromo-1,1-dichloroethane | 1.00 | 56.7 |
| 2 1,2-Dibromo-1,1,2-trichloroethane | 0.90 | 56.2 |
| 3 1,2-Dibromotetrachloroethane | 0.82 | 55.8 |
| 4 1,2-Dibromo-1,1-dichloro-2,2-difluoroethane | 0.47 | 57.2 |
| 5 Triiodomethane | 0.24 | 41.5 |
| 6 Bromotrichloromethane | 0.22 | 57.4 |
| 7 1,2-Diiodotetrafluoroethane | 0.22 | 52.1 |
| 8 2,3-Dibromo-1-propanol | 0.20 | 61.8 |
| 9 1,1,1,4,4,4-Hexabromo-2-butene | 0.19 | —** |
| 10 Tetrabromomethane | 0.19 | 51.8 |
| 11 1,2-Dibromo-1,2-dichloroethane | 0.17 | 59.0 |
| 12 1,2-Diidoethane | 0.17–0.24 | 49.0 |
| 13 Bromodiphenylmethane | 0.17–0.24 | 61.3 |
| 14 Chlorodiphenylmethane | 0.17–0.24 | 74.1 |
| 15 1,2-Dibromo-1,1-dimethylethane | 0.17–0.24 | 57.4 |
| 16 1-Iodo-2-bromo-2-fluoroethane | 0.17–0.24 | 50.6 |
| 17 1,2-Dibromo-1,2-diphenylethane | 0.17–0.24 | 59.8 |
| 18 $\alpha,\alpha'$-Dibromo-$\alpha,\alpha,\alpha',\alpha'$-tetraphenyl-p-xylene | 0.17–0.24 | 59.2 |
| 19 2-Bromo-5,5-dimethyl-1,3-cyclohexanedione | 0.14 | 60.9 |
| 20 1,2-Dibromotetrafluoroethane | 0.12 | 65.9 |
| 21 1,2,3.4-Tetrabromobutane | 0.12 | 58.5 |
| 22 1,2-Dibromocyclohexane | 0.10 | 59.0 |
| 23 1,4-Dibromo-2,3-butanedione | 0.09–0.24 | —** |
| 24 Benzalbromide | 0.09–0.24 | 58.8 |
| 25 1,3-Dibromobutane | 0.09–0.24 | 60.0 |
| 26 1,4-Dibromobutane | 0.09–0.24 | 62.3 |
| 27 Diiodomethane | 0.09–0.24 | 46.7 |
| 28 2,4,4,6-Tetrabromo-2,5-cyclohexadiene-1-one | 0.09–0.24 | —** |
| 29 4,4-Dimethylcyclohexylbromide-2,6-dione | 0.09–0.16 | 60.9 |
| 30 1,6-Dibromohexane | 0.09–0.16 | 62.3 |
| 31 4-Chloromethylbiphenyl | 0.09–0.16 | 76.6 |
| 32 2-Bromoadamantane | 0.09–0.16 | —** |
| 33 3-Chloro-1-butyne | 0.09–0.16 | 77.7 |
| 34 4-Chloromethyl-o-xylene | 0.09–0.16 | 76.6 |
| 35 $\alpha$,2,6-Trichlorotoluene | 0.06 | 76.6 |
| 36 $\alpha,\alpha'$-Dibromo-p-xylene | 0.06 | 63.3 |
| 37 4-Bromobiphenyl | 0.00–0.16 | 67.8 |
| 38 2-Bromobiphenyl | 0.00–0.16 | 67.8 |
| 39 4-Chlorobiphenyl | 0.00–0.08 | 74.6 |
| 40 2-Chloroethoxyethoxyethanol | 0.00–0.08 | 74.6 |
| 41 2-Cyanotrifluoromethylbenzene | 0.00–0.08 | 115.6 |
| 42 1-Chlorododecane | 0.00–0.08 | 73.4 |
| 43 $\beta$-Chloropropionaldehyde | 0.00–0.08 | 75.7 |
| 44 o-chlorobenzylidine malononitrile | 0.00–0.08 | —** |

*The haloorganic compounds are numbered in the Examples below as they appear in Table 2.
**BDE was not calculated because the formula of L. A. Errede, J. Phys. Chem., Vol. 64 (1960) pp. 1031–1034 does not apply to this structure.

EXAMPLE 1

The following haloorganic compounds present in the composition of this Example set forth in Table 2 were tested for printout image intensity by visual inspection and ranked as described in Scale B above. The results are shown in Table 3.

TABLE 3

| Haloorganic Compound | Printout Image Intensity |
|---|---|
| 2 | Excellent |
| 3 | Excellent |
| 5 | Good |
| 8 | Fair to Good |
| 10 | Good |
| 21 | Fair to Good |
| 23 | Fair |
| 24 | Fair to Good |
| 25 | Fair to Good |
| 26 | Fair to Good |
| 27 | Fair to Good |
| 28 | Fair to Good |
| 30 | Fair |
| 36 | Poor to Fair |

EXAMPLE 2

The following haloorganic compounds present in the composition of this Example set forth in Table 2 were tested for printout image intensity by visual inspection and ranked as described in Scale B above. The results are shown in Table 4.

TABLE 4

| Haloorganic Compound | Printout Image Intensity |
|---|---|
| 1 | 2 |
| 3 | 1 |
| 5 | 2 |
| 7 | 3–4 |
| 13 | 2 |
| 14 | 2 |
| 15 | 2 |
| 16 | 2 |
| 17 | 2 |
| 18 | 2 |
| 29 | 3 |
| 31 | 3 |
| 32 | 3 |
| 33 | 3 |
| 34 | 3 |
| 35 | 3 |
| 37 | 3–4 |
| 38 | 3–4 |
| 39 | 4 |
| 40 | 4 |
| 41 | 4 |
| 42 | 4 |
| 43 | 4 |

EXAMPLE 3

The procedure of Example 2 was repeated except that the composition was of this Example set forth in Table 2. The results are shown in Table 5.

TABLE 5

| Haloorganic Compound | Printout Image Intensity |
|---|---|
| 3 | 1 |
| 7 | 3–4 |
| 13 | 2 |
| 14 | 2 |
| 15 | 2 |
| 16 | 2 |
| 17 | 2 |
| 18 | 2 |
| 28 | 2 |
| 33 | 3 |
| 34 | 3 |
| 35 | 3 |

TABLE 5-continued

| Haloorganic Compound | Printout Image Intensity |
|---|---|
| 43 | 4 |
| 44 | 4 |

EXAMPLE 4

The following haloorganic compounds present in the composition of this Example set forth in Table 2 were tested for printout image intensity by determining the optical density at 600 nm as read with a Perkin-Elmer Model 330 UV-VIS spectrophotometer both before and after a saturating photoexposure. The difference between the two readings is the printout image intensity for the numbered compounds and is shown in Table 6.

TABLE 6

| Haloorganic Compound | Printout Image Intensity |
|---|---|
| 1 | 0.205 |
| 3 | 0.115 |
| 5 | 0.055 |
| 7 | 0.030 |
| 8 | 0.065 |
| 11 | 0.070 |

EXAMPLE 5

The procedure of Example 4 was repeated except that the composition was of this Example set forth in Table 2. The results are shown in Table 7.

TABLE 7

| Haloorganic Compound | Printout Image Intensity |
|---|---|
| 1 | 0.300 |
| 3 | 0.250 |
| 5 | 0.140 |
| 7 | 0.030 |
| 8 | 0.105 |
| 11 | 0.095 |

EXAMPLE 6

The procedure of Example 5 was repeated except that the composition was of this Example set forth in Table 2. In addition, C.I. Pigment Green 18 was replaced by 0.02% Victoria Green Basic Dye C.I. No. 42030. An 0.08 inch (0.20 mm) doctor knife was used to apply the coating. The results are shown in Table 8.

TABLE 8

| Haloorganic Compound | Printout Image Intensity |
|---|---|
| 1 | 1.70 |
| 3 | 1.85 |
| 4 | 1.15 |
| 5 | 0.45 |
| 6 | 0.65 |
| 7 | 0.65 |
| 9 | 0.60 |
| 12 | 0.55 |

EXAMPLE 7

The procedure of Example 5 was repeated except that the composition was of this Example set forth in Table 2. The coatings were applied using an 0.010 inch (0.25 mm) doctor blade. dried for 40 minutes in air and laminated with 0.001 inch (0.025 mm) polyethylene film. A sample of each film was exposed 35 units on the Berkey-Ascor exposure source. The results are shown in Table 9.

TABLE 9

| Haloorganic Compound | Printout Image Intensity |
|---|---|
| 1 | 2.55 |
| 3 | 2.88, 2.86 |
| 5 | 0.68 |
| 7 | 0.64 |
| 8 | 0.96 |
| 10 | 0.91 |
| 11 | 0.90 |
| 21 | 0.70 |
| 23 | 0.64 |
| 30 | 0.68 |
| 36 | 0.60 |
| None (Control) | 0.49 |

EXAMPLE 8

Two photoimaging compositions were prepared from the following ingredients:

| Ingredients | Sample A (g) | Sample A (%) | Sample B (g) | Sample B (%) |
|---|---|---|---|---|
| Polymethylmethacrylate $\overline{M}w$ is 29,000, $\overline{M}n$ is 15,000 P.D.I. is 1.93 | 12.37 | 41.25 | 12.37 | 41.25 |
| Polymethylmethacrylate Mw is 629,000, $\overline{M}n$ is 129,000 P.D.I. is 4.86 | 12.38 | 41.25 | 12.38 | 41.25 |
| Leuco Crystal Violet | 0.30 | 1.00 | 0.3 | 1.00 |
| Decyl alcohol* | 4.71 | 15.70 | — | — |
| 2-octyl bromide | — | — | 4.95 | 16.50 |
| 1,2-dibromotetrachloro-ethane | 0.24 | 0.80 | — | — |
| Total solutes | 30 | 100 | 30 | 100 |
| Methylene chloride | 90 | — | 90 | — |
| Percent solutes in solution (W/W) | — | 25 | — | 25 |

*Decyl alcohol is added to equalize the plasticizing action that 2-octyl bromide imparts to Sample B composition.

The above ingredients were added to brown bottles, capped and rolled overnight on a two-roll mill of approximately 2.5 inches (6.35 cm) roll diameter. The two compositions were coated on polyethylene terephthalate film, 0.001 inch (0.025 mm) in thickness using a 0.010 inch (0.25 mm) doctor knife, and air dried for 30 minutes.

Film samples, 6 inches by 0.5 inch (152.4 mm by 12.7 mm) were attached to a single copper board, exposed 17.52 minutes to 313 nm radiation using a spectrosensitometer, each film sample receiving 14.45 millijoules/cm² exposure. The samples were evaluated visually and ranked on Scale A described above. The ratings attained were:
Sample A: Excellent
Sample B (control): Fair-to-poor

EXAMPLE 9

The following photopolymerizable compositions were prepared according to the Evaluation and Testing section preceding the Examples. The compositions were coated on polyethylene terephthalate film as described in the second paragraph of the Evaluation and Testing section and were exposed as described in the third paragraphs of the Evaluation and Testing section.

Samples A, B, G and H were exposed for 30 minutes and Samples C, D, E and F for 300 units.

INGREDIENTS (190)

1: Dye, leuco form*
2: Michlers ketone
3: Benzophenone
4: 2,2'-bis(o-chlorophenyl)-4,4'-5,5'-tetraphenyl-biimidazole
5: Victoria Green (C.I. 42030)
6: Victoria Green C.I. Pigment Green 18 (pigment 30%) rollmill blended with methylmethacrylate(34)/styrene(42)/acrylonitrile(8)-/butadiene(16) interpolymer
7: Poly(methylmethacrylate(45%)/acrylonitrile (10%)/butadiene(15%)/styrene(30%)
8: Poly(methylmethacrylate)$\overline{M}$w:629,000 $\overline{M}$n:129,000, polydispersity index 4.86
9: Trimethylolpropane triacrylate
10: Mixture of ortho- and para-toluenesulfonamide
11: Benzotriazole
12: p-toluenesulfonic acid
13: 1,2-dibromotetrachloroethane

| # | Samples (%) A | B | C | D | E | F | G | H |
|---|---|---|---|---|---|---|---|---|
| 1 | 0.5 | 0.5 | 0.5 | 0.5 | 1.0 | 1.0 | 0.5 | 0.5 |
| 2 | 0.12 | 0.12 | 0.12 | 0.12 | 0.12 | 0.12 | 0.12 | 0.12 |
| 3 | 4.0 | 4.0 | 4.0 | 4.0 | 4.0 | 4.0 | 4.0 | 4.0 |
| 4 | — | — | — | — | 1.0 | 1.0 | — | — |
| 5 | 0.035 | 0.035 | — | — | — | — | 0.035 | 0.035 |
| 6 | 0.112 | 0.112 | — | — | — | — | 0.112 | 0.112 |
| 7 | 46.72 | 46.72 | 46.72 | 46.72 | 46.72 | 46.72 | 46.72 | 46.72 |
| 8 | 10.0 | 10.0 | 10.0 | 10.0 | 10.0 | 10.0 | 10.0 | 10.0 |
| 9 | 30.0 | 30.0 | 30.0 | 30.0 | 30.0 | 30.0 | 30.0 | 30.0 |
| 10 | 6.0 | 6.0 | 6.0 | 6.0 | 6.0 | 6.0 | 6.0 | 6.0 |
| 11 | 0.2 | 0.2 | 0.2 | 0.2 | 0.2 | 0.2 | 0.2 | 0.2 |
| 12 | 0.05 | 0.05 | 0.05 | 0.05 | 2.0 | 2.0 | 0.05 | 0.05 |
| 13 | — | 0.1 | — | 0.1 | — | 0.2 | — | 0.1 |

*The leuco dyes are as follows:
A and B: tris-(-4-diethylamino-o-tolyl)-methane
C and D: bis-(-4-diethylamino-o-tolyl)-2-thienylmethane
E and F: 2-(-4-diethylaminophenylmethyl)-3-hydroxy-1-indanone
G and H: bis-(-4-diethylamino-o-tolyl)-2-furylmethane The printout Image Intensity of the Samples using Scale A is as follows:

| Sample | Printout Image Intensity |
|---|---|
| A | None |
| B | Fair to Poor |
| C | None |
| D | Poor |
| E (control) | Poor |
| F (control) | Poor |
| G | Fair to Poor |
| H | Good to Excellent |

What is claimed is:
1. A printout photoimaging composition consisting essentially of an admixture of
(a) a substituted 1,2-dibromoethane of the formula

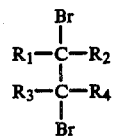

wherein a first bond dissociation energy for the C—Br bond of the carbon atom attached to $R_1$ and $R_2$ is not greater than 59 kilocalories per mol.°C. and is not greater than the dissociation energy of the second C—Br bond, $R_1$ and $R_2$ are individually either chlorine or $CCl_3$; $R_3$ and $R_4$ independently are H—, F—, Cl—, lower alkyl of 1 to 3 carbon atoms, $F_3C$—, $ClH_2C$—, and straight chain α-monofluorinated aliphatic radical optionally branched and/or unsaturated only beyond the γ-carbon atom, said α-carbon atom being that nearest the carbon holding the second carbon-bromine bond;

(b) a leuco dye in leuco form which is the reduced form of the dye having one or two hydrogen atoms, the removal of which together with an additional electron produces a differently colored compound.

2. A composition according to claim 1 wherein (a) is a 1,2-dibromo-1,1-dichloroethane of the formula:

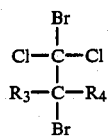

wherein $R_3$ and $R_4$ independently are hydrogen, chlorine or fluorine.

3. A composition according to claim 1 wherein (a) is a 1,2-dibromoethane compound taken from the group consisting of

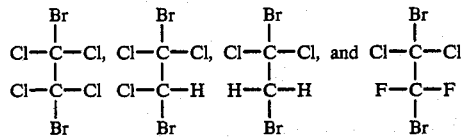

4. A composition according to claim 1 wherein the substituted 1,2-dibromoethane (a) and leuco dye (b) are present in a solvent for said components.

5. A composition according to claim 4 wherein the solvent is methylene chloride and methanol.

6. A photoimaging photopolymerizable composition consisting essentially of an admixture of (a) a substituted 1,2-dibromoethane of the formula

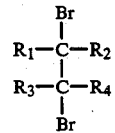

wherein a first bond dissociation energy for the C—Br bond of the carbon atom attached to $R_1$ and $R_2$ is not greater than 59 kilocalories per mol.°C. and is not greater than the dissociation energy of the second C—Br bond, $R_1$ and $R_2$ are individually either chlorine or $CCl_3$; $R_3$ and $R_4$ independently are H—, F—, Cl—, lower alkyl of 1 to 3 carbon atoms, $F_3C$—, $ClH_2C$—, and straight chain α-monofluorinated aliphatic radical optionally branched and/or unsaturated only beyond the γ-carbon atom, said α-carbon atom being that nearest the carbon holding the second carbon-bromine bond;

(b) a leuco dye in leuco form which is the reduced form of the dye having one or two hydrogen atoms, the removal of which together with an additional electron produces a differently colored compound;

(c) at least one nongaseous ethylenically unsaturated compound having a boiling point above 100° C. at normal atmospheric pressure;

(d) a photoinitiator taken from the group consisting of -4-trichloromethyl-2,5-cyclohexadienones, benzophenones, alkylaryl ketones, and mixtures thereof; and (e) optionally at least one organic polymeric binder.

7. A photoimaging composition according to claim 6 wherein the photoinitiator is a combination of Michler's ketone, benzophenone and a -4-trichloromethyl-4-methyl-2,5-cyclohexadienone compound.

8. A photoimaging composition according to claim 7 wherein the cyclohexadienone compound is 4-methyl-4-trichloromethyl-2,5-cyclohexadienone.

9. A photoimaging composition according to claim 6 wherein the photoinitiator is a combination of Michler's ketone and benzophenone.

10. A photoimaging composition according to claim 6 where components (a), (b), (c), (d) and (e) are present in the weight percent ranges based on the total weight of the photopolymerizable composition
(a) 0.001 to 80,
(b) 0.05 to 90,
(c) 1 to 90,
(d) 0.001 to 20, and
(e) 0 to 90, 11. A photoimaging composition according to claim 6 wherein the leuco dye is the salt of an acid in leuco form of a triphenylmethane dye having in at least two of the phenyl rings positioned para to the methane carbon atom, a substituent selected from the group consisting of amino, and $C_1$ to $C_4$ dialkyl amino groups, the acid being a mineral acid, an organic acid, or an acid-supplying compound.

12. A photoimaging composition according to claim 6 wherein at least one film-forming organic polymeric binder is present.

13. A photoimaging element comprising a support bearing a dry layer of a composition according to claim 1.

14. A photopolymerizable element comprising a support bearing a dry layer of a composition according to claim 6.

15. An element according to claim 14 wherein the support is a film.

16. An element according to claim 15 wherein the support is polyethylene terephthalate.

17. An element according to claim 14 wherein the support is copper.

18. A printout photoimaging composition consisting essentially of an admixture of (a) a substituted 1,2-dibromoethane of the formula

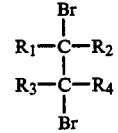

wherein a first bond dissociation energy for the C—Br bond of the carbon atom attached to $R_1$ and $R_2$ is not greater than 59 kilocalories per mol.°C. and is not greater than the dissociation energy of the second C—Br bond, $R_1$ and $R_2$ are individually either chlorine or $CCl_3$; $R_3$ and $R_4$ independently are H—, F—, Cl—, lower alkyl of 1 to 3 carbon atoms, $F_3C$—, $ClH_2C$—, and straight chain α-monofluorinated aliphatic radical optionally branched and/or unsaturated only beyond the γ-carbon atom, said α-carbon atom being that nearest the carbon holding the second carbon-bromine bond;

(b) a leuco dye taken from the group consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leuco indamines, aminohydrocinnamic acids, hydrazines, leuco indigoid dyes, amino-2,3-dihydroanthraquinones, tetrahalo-p,p'-biphenols, 2(p-hydroxyphenyl)-4,5-diphenylimidazoles, and phenethylanilines.

19. A photoimaging photopolymerizable composition consisting essentially of an admixture of (a) a substituted 1,2-dibromoethane of the formula

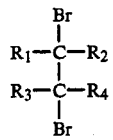

wherein a first bond dissociation energy for the C—Br bond of the carbon atom attached to $R_1$ and $R_2$ is not greater than 59 kilocalories per mol.°C. and is not greater than the dissociation energy of the second C—Br bond, $R_1$ and $R_2$ are individually either chlorine or $CCl_3$; $R_3$ and $R_4$ independently are H—, F—, Cl—, lower alkyl of 1 to 3 carbon atoms, $F_3C$—, $ClH_2C$—, and straight chain α-monofluorinated aliphatic radical optionally branched and/or unsaturated only beyond the γ-carbon atom, said α-carbon atom being that nearest the carbon holding the second carbon-bromine bond;

(b) a leuco dye taken from the group consisting of aminotriarylmethanes, aminoxanthenes, aminothioxanthenes, amino-9,10-dihydroacridines, aminophenoxazines, aminophenothiazines, aminodihydrophenazines, aminodiphenylmethanes, leuco indamines, aminohydrocinnamic acids, hydrazines, leuco indigoid dyes, amino-2,3-dihydroanthraquinones, tetrahalo-p,p'-biphenols, 2(p-hydroxyphenyl)-4,5-diphenylimidazoles, and phenethylanilines.

(c) at least one nongaseous ethylenically unsaturated compound having a boiling point above 100° C. at normal atmospheric pressure;

(d) a photoinitiator taken from the group consisting of -4-trichloromethyl-2,5-cyclohexadienones, benzophenones, alkylaryl ketones, and mixtures thereof; and (e) optionally at least one organic polymeric binder.

* * * * *